(12) United States Patent
Reitterer et al.

(10) Patent No.: US 9,664,357 B2
(45) Date of Patent: May 30, 2017

(54) DEVICE FOR GENERATING MULTIPLE COLLIMATED LIGHT BEAMS

(71) Applicant: TriLite Technologies GmbH, Neutal (AT)

(72) Inventors: Joerg Reitterer, Vienna (AT); Franz Fidler, Vienna (AT); Christian Hambeck, Gerersdorf (AT); Ferdinand Saint Julien-Wallsee, Vienna (AT)

(73) Assignee: TriLite Technologies GmbH, Vienna (AT)

( * ) Notice: Subject to any disclaimer, the term of this patent is extended or adjusted under 35 U.S.C. 154(b) by 20 days.

(21) Appl. No.: 14/788,926

(22) Filed: Jul. 1, 2015

(65) Prior Publication Data

US 2016/0025298 A1  Jan. 28, 2016

(30) Foreign Application Priority Data

Jul. 25, 2014 (EP) ..................................... 14178525

(51) Int. Cl.

| | |
|---|---|
| *F21V 9/00* | (2015.01) |
| *F21V 5/04* | (2006.01) |
| *G02B 19/00* | (2006.01) |
| *G02B 3/00* | (2006.01) |
| *G02B 3/06* | (2006.01) |
| *H01S 5/00* | (2006.01) |
| *H01S 5/40* | (2006.01) |
| *F21V 5/00* | (2015.01) |
| *G02B 27/30* | (2006.01) |
| *F21Y 101/00* | (2016.01) |
| *F21Y 115/30* | (2016.01) |

(52) U.S. Cl.
CPC ............. *F21V 5/043* (2013.01); *F21V 5/008* (2013.01); *G02B 3/005* (2013.01); *G02B 3/0087* (2013.01); *G02B 3/06* (2013.01); *G02B 19/0014* (2013.01); *G02B 19/0057* (2013.01); *G02B 19/0066* (2013.01); *G02B 27/30* (2013.01); *H01S 5/005* (2013.01); *H01S 5/4025* (2013.01); *F21Y 2101/00* (2013.01); *F21Y 2115/30* (2016.08)

(58) Field of Classification Search
CPC ............................. H01S 5/005; H01S 5/02248
USPC ......................... 362/231, 240, 244, 249.02
See application file for complete search history.

(56) References Cited

U.S. PATENT DOCUMENTS

| | | |
|---|---|---|
| 6,700,709 B1 | 3/2004 | Fermann |
| 2006/0203873 A1 | 9/2006 | Gao et al. |

(Continued)

OTHER PUBLICATIONS

European Search Report for Application No. 14178525.3-1553 dated Jan. 30, 2015.

*Primary Examiner* — Vip Patel
(74) *Attorney, Agent, or Firm* — Hoffmann & Baron, LLP

(57) ABSTRACT

A device for generating multiple collimated light beams includes a carrier and at least two light generation units mounted on the carrier. The light generation units are configured to emit, each from an aperture, light beams at respectively different wavelengths and being arranged, with respect to axes of the light beams, substantially parallel and substantially in a common plane. A first lens is mounted on the carrier intersectingly to the axes of the light beams and has a principal plane. The light generation units have their apertures aligned along an alignment line substantially perpendicular to the axes of the light beams and the principal plane of the first lens is non-perpendicular to the axes of the light beams and is non-parallel to the alignment line.

23 Claims, 4 Drawing Sheets

(56) References Cited

U.S. PATENT DOCUMENTS

2009/0323193 A1 12/2009 Miyajima et al.
2011/0228230 A1 9/2011 Inoue et al.

(State of the Art)

(State of the Art)

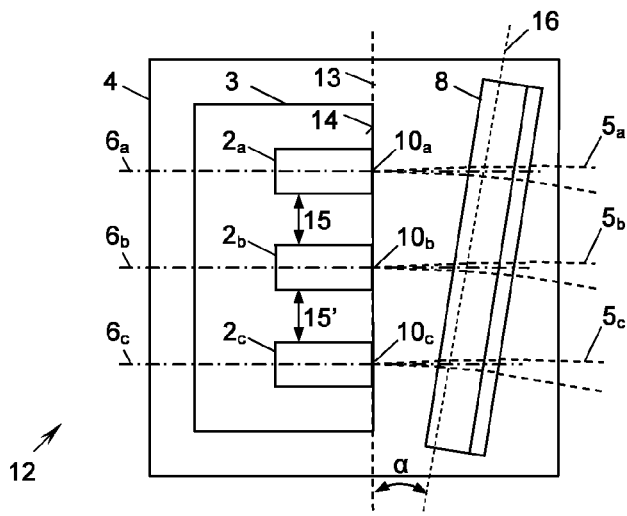
*Fig. 4*
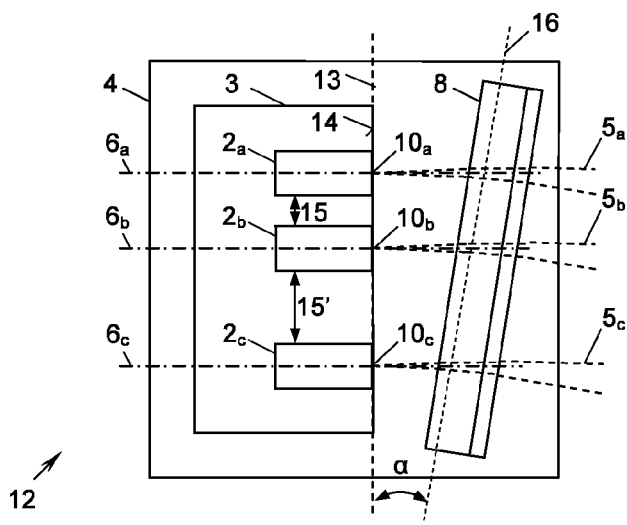
*Fig. 5*
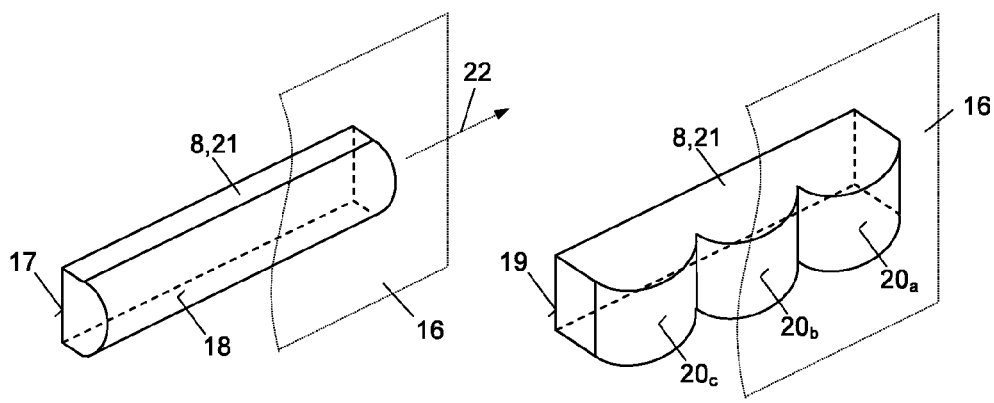
*Fig. 6a*  *Fig. 6b*

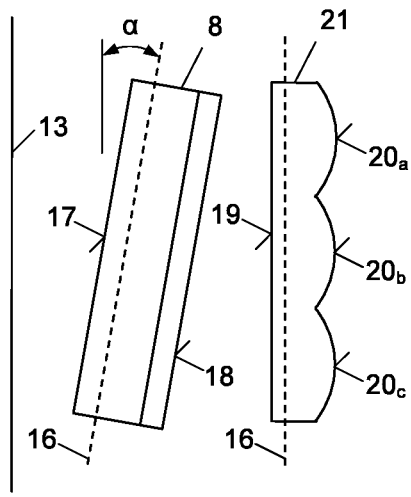
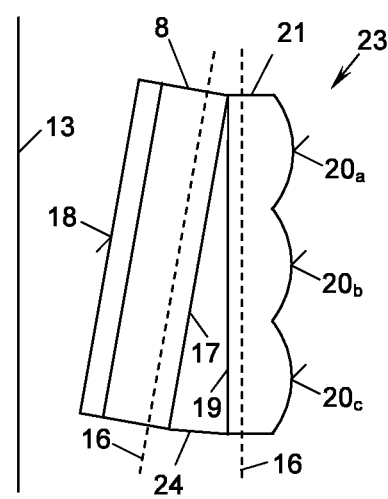
*Fig. 9a*  *Fig. 9b*
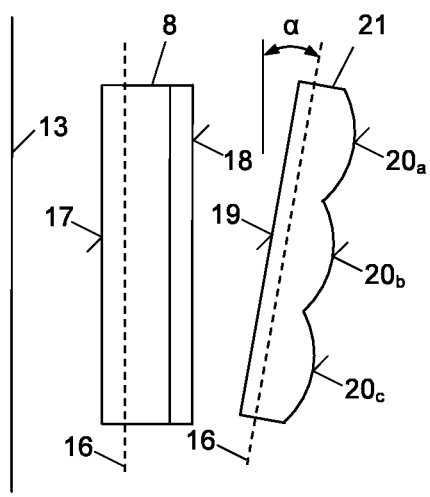
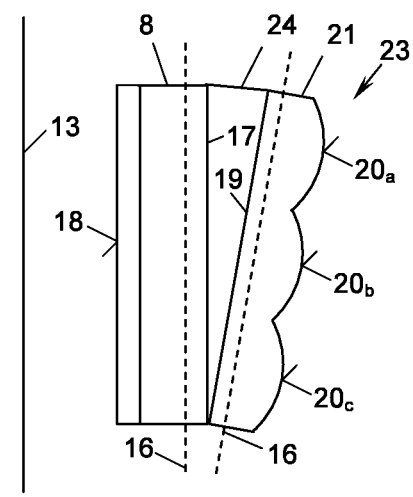
*Fig. 10a*  *Fig. 10b*

DEVICE FOR GENERATING MULTIPLE COLLIMATED LIGHT BEAMS

CROSS-REFERENCE TO RELATED APPLICATION

This application claims priority to European Patent Application No. 14 178 525.3, filed on Jul. 25, 2014, the entirety of which is incorporated by reference herein.

BACKGROUND

The present invention relates to a device for generating multiple collimated light beams.

FIGS. 1 and 2 show such a device 1 according to the state of the art as described in e.g. WO 2012/113856 A1 and WO 2012/113883 A2. The device 1 can be used as a light source for a pixel of a display or projector and is, for example, capable of emitting selectively controlled red, green and blue light beams which superpose in the viewer's eye to yield any desired colour. To this end, three light generation units $2_a$, $2_b$, $2_c$ are mounted —via a submount 3—on a carrier 4 and emit light beams $5_a$, $5_b$, $5_c$ at respectively different wavelengths $\lambda_a$, $\lambda_b$, $\lambda_c$ (here: red, green, blue).

Due to physical and manufacturing constraints, the light beams $5_a$, $5_b$, $5_c$ emitted from the light generation units $2_a$, $2_b$, $2_c$ each diverge around an axis ("mean" or "primary" axis) $6_a$, $6_b$, $6_c$. If light generation units based on conventional edge emitting laser diodes are used, the emitted light beams $5_a$, $5_b$, $5_c$ will diverge "fast" (broadly) along a direction $d_f$ corresponding to a p-n transition ("edge") 7 in the laser diodes, and will diverge "slowly" (narrowly) in a direction $d_s$ perpendicular thereto. To collimate the light beams $5_a$, $5_b$, $5_c$ in the direction $d_f$ a so-called fast axis collimation (FAC) lens 8 is mounted in front of the light generation units $2_a$, $2_b$, $2_c$. Alternatively or additionally, there can also be arranged a slow axis collimation (SAC) lens to collimate the light beams $5_a$, $5_b$, $5_c$ in the slowly diverging direction $d_f$ (not shown).

Lenses, such as the FAC (and SAC) lens 8 mentioned, have wavelength dependent focal points (focal lengths) due to the wavelength dependency of their refraction index, known as chromatic aberration. This is depicted in FIG. 3, where the non-linear wavelength dependency of the back focal length is shown for a specific lens. On the horizontal axis, the wavelength $\lambda$ of the light traversing the lens is depicted, while the vertical axis depicts the focal length f. As can readily be seen at curve 9, in the visible light range (depicted by the vertical, dashed lines) the wavelength dependency is non-linear, leading to complicated chromatic aberrations.

According to FIG. 2, the state of the art overcomes this problem by mounting each of the light generation units $2_a$, $2_b$, $2_c$ further away from the lens 8 to move their apertures $10_a$, $10_b$, $10_c$ into a distance $11_a$, $11_b$, $11_c$ from the lens 8 corresponding to the back focal length of the lens 8 for the respective wavelength $\lambda_a$, $\lambda_b$, $\lambda_c$ used. However, this solution brings several problems. Firstly, manufacturing a submount 3 with individually backwards shifted light generation units $2_a$, $2_b$, $2_c$ turns out to be a complex and minute task, since the light generation units $2_a$, $2_b$, $2_c$ need to be applied with very small tolerances away from the lens 8 somewhere in the middle of the submount 3. Once the light generation units $2_a$, $2_b$, $2_c$ are bonded onto the submount 3, there is no way of calibrating the device 1, while there is also no way of readjusting them to compensate e.g. aging effects.

Secondly, because of the fast divergence of the light beams $5_a$, $5_b$, $5_c$ in the vertical direction $d_f$, a lower part of the light beams $5_a$, $5_b$, $5_c$ gets cut off when the light generation units $2_a$, $2_b$, $2_c$ are mounted away from an edge of the submount 3, whereupon only a fraction of the light beams $5_a$, $5_b$, $5_c$ can be used for collimation. This problem is aggravated by the fact that conventional edge-emitting laser diodes used for the light generation units $2_a$, $2_b$, $2_c$ are mounted with their p-side facing downwards for thermal reasons and thus have their edges 7 and consequently their apertures $10_a$, $10_b$, $10_c$ near the bonding submount 3, so that an even larger percentage of the light beams $5_a$, $5_b$, $5_c$ gets cut off upon moving backwards on the submount 3.

Additionally, because the individual light generation units $2_a$, $2_b$, $2_c$ have to be moved back by different lengths $11_a$, $11_b$, $11_c$, the intensity of the collimated light beams $5_a$, $5_b$, $5_c$ will differ since a larger percentage of a light beam is cut off the further back the light generation unit is shifted. Thus, the light generation units $2_a$, $2_b$, $2_c$ have to be corrected in output intensity, too.

SUMMARY

It is an object of the invention to provide an improved device for generating multiple collimated light beams which overcomes the above-mentioned drawbacks of the state of the art.

To this end, the invention provides for a device for generating multiple collimated light beams, comprising: a carrier; at least two light generation units mounted on the carrier, the light generation units being configured to emit, each from an aperture, light beams at respectively different wavelengths and being arranged, with respect to axes of the light beams, substantially parallel and substantially in a common plane; and a first lens mounted on the carrier intersectingly to the axes of the light beams and having a principal plane; wherein the light generation units have their apertures aligned along an alignment line substantially perpendicular to the axes of the light beams; wherein said principal plane of the first lens is non-perpendicular to the axes of the light beams and is non-parallel to the alignment line.

The invention thus provides for a light beam generation device which is easy to calibrate, since the light generation units can be aligned along a straight line, thus simplifying the manufacturing process, while compensating for the chromatic aberration by tilting a common (FAC or SAC) lens. The alignment can be done with a larger tolerance than in the state of the art, since misalignments or aging effects can be corrected by tilting the lens around a correction angle. Furthermore, a subsequent calibration after the bonding can be achieved by newly adjusting the angle of the lens, if the latter is mounted releasably.

Because the light generation units can be arranged along a common alignment line such as e.g. an edge of the submount or carrier, the diverging light beams do not get cut off. Thus, the entire cross section of the light beams can be used for collimation, yielding a highest possible, uniform intensity of the collimated beams without the further need of readjusting individual light generation units in intensity.

Another advantage of the device according to the invention is that the lens is at a slant with respect to the propagation direction of the light beams. The amount of light reflected from the lens into the light generation unit is thereby reduced and unwanted effects such as hysteresis phenomena or a prolongation of the relaxation oscillation otherwise encountered in laser diodes are thereby avoided.

In view of this, there is no need to apply a high-quality anti-reflection coating with a large number of dielectric layers onto the lens, thereby reducing costs of the device. Higher intensities of light beams emerging from the lens can also be achieved.

In a first-order approximation, the light generation units can be spaced at equal distances from each other on the alignment line, which yields a simple manufacturing processes. However, in another embodiment the apertures may be spaced at unequal distances from each other along the alignment line. Thereby, the light generation units can be adjusted to the non-linear wavelength-dependent focal length of the lens as precisely as desired, while still being aligned along a straight line. Since the uneven spacing gives a further degree of freedom additional to the tilting of the lens and the distance of the lens to the light generation units, the tolerance limits are effectively split up between said degrees of freedom.

In a further embodiment of the invention, there are three light generation units mounted on the carrier, configured to emit a green, a red and a blue light beam. This setup enables the device to be used as a basis for pixels of a full colour display or projector. Alternatively, it is also possible to use two, four, or even more light generation units, which may also emit light beams at different wavelengths than the ones mentioned, e.g. which do not lie in the visible light spectrum.

With the device according to the invention, it is particularly favourable when the light generation units are mounted on the carrier via a submount. Thereby, ready-made submounts with bonded light generation units can be manufactured, which can in turn be mounted onto the carrier of the device. The device can then be built using ready-made sets of individual lenses and submounts, which can be sold separately and combined individually.

In a further embodiment, the alignment line lies parallel to an edge of the submount, e.g. on the edge. The light generation units can thus be mounted as easily as possible, while gaining an extra clearance from the carrier, making it possible to avoid a "cut-off" of the light beam, even though the light generation units are not arranged on the edge of the carrier.

In another embodiment, the light generation units each comprise a laser diode. Such laser diodes can be bonded onto or even integrated into the submount to further reduce the build height.

Several types of lenses and lens combinations can be used for the device according to the invention to collimate the light beams emitted by the light generation units. The lenses could even be made out of a material having a graded refraction index (GRIN), however, for ease of manufacture materials with a homogeneous refraction index can be used.

In one embodiment, a single FAC lens can be used on the carrier. Such a lens can be a rod lens having a constant profile along a longitudinal direction of the lens. These sort of lenses are especially easy to produce. The lens may be an acylindrical rod lens to reduce the spherical aberration.

In an alternative embodiment, a single SAC lens can be mounted on the carrier in the inventive way, i.e. such a lens can have a planar side and at least two, in particular three, parallel cylindrical bulges on an opposite side thereof.

It is also possible to combine the above-mentioned FAC and SAC lenses, namely a first (FAC) lens collimates the diverging light beam into a light fan, whereupon a second (SAC) lens collimates the light fan into a collimated light beam, or the other way around, respectively. The FAC lens can, for example, be at a non-zero angle and the SAC lens at an arbitrary angle towards the alignment line, i.e. the first lens is an acylindrical rod lens and a second lens, having a planar side and at least two, in particular three, cylindrical bulges on an opposite side thereof, is mounted before or after the first lens on the carrier when seen in the propagation direction of the light beams.

Alternatively the SAC lens can be at a non-zero angle and the FAC lens at an arbitrary angle towards the alignment line, i.e. the first lens has a planar side and two or more parallel cylindrical bulges on an opposite side thereof and the second lens, being an acylindrical rod lens, is mounted before or after the first lens on the carrier when seen in the propagation direction of the light beams.

As just mentioned, said second lens could be parallel to the alignment line, but in several embodiments it is not, i.e. also the second lens has a principal plane which is non-perpendicular to the axes of the light beams and is non-parallel to the alignment line. If the first and the second lens are made out of a different material with a different refraction index and/or the focal lengths are different due to different radii of curvature, the principal plane of the first (FAC or SAC) lens could lie at a different angle to the alignment line than the principal plane of the second (SAC or FAC) lens.

In all those embodiments, a planar side of the first lens can optionally be joined—e.g. monolithically—to a planar side of the second lens, to form an especially compact component.

In some cases, e.g. when the FAC lens and the SAC lens are at a different angle to each other and are to be joined together, a transparent wedge can be used to join a planar side of the first lens and the planar side of the second lens. In particular, the wedge can be joined with the lenses monolithically, i.e. forming a single piece.

BRIEF DESCRIPTION OF THE DRAWINGS

The invention shall now be explained in more detail on the basis of exemplary embodiments thereof with reference to the accompanying drawings, in which:

FIG. 4 shows a first embodiment of the device according to the invention in a schematic plan view;

FIG. 5 shows a second embodiment of the device according to the invention in a schematic plan view;

FIGS. 6a and 6b show two different embodiments of a lens of the devices of FIGS. 4 and 5 in perspective views; and FIGS. 7a, 7b, 8a, 8b, 9a, 9b, 10a and 10b show different combinations of the lenses of FIGS. 6a and 6b as can be used in the devices of FIGS. 4 and 5 in schematic plan views.

DETAILED DESCRIPTION

Figure 1:
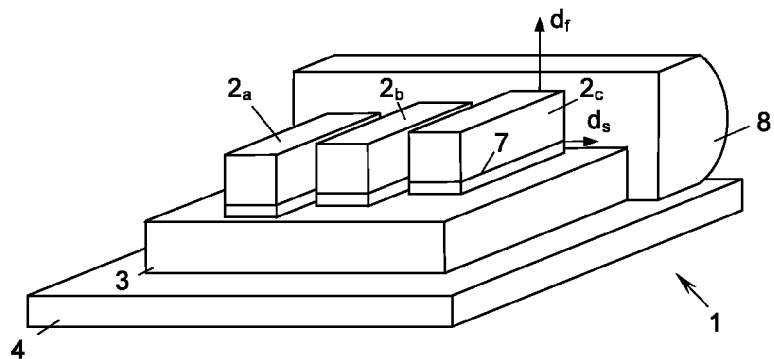
FIG. 1 shows a device according to the state of the art in a perspective view.
Figure 2:
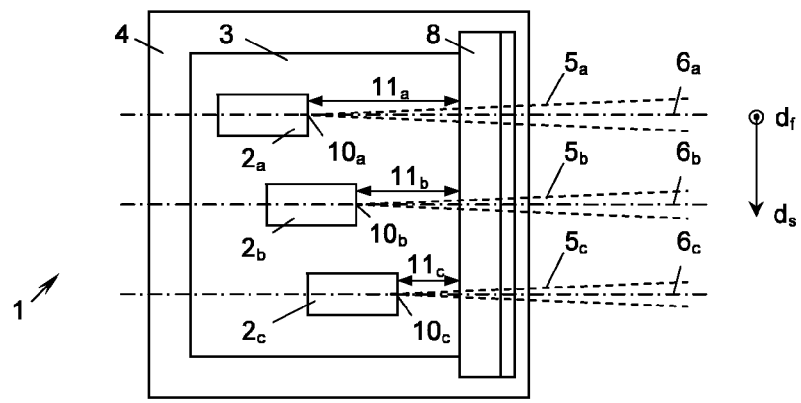
FIG. 2 shows the device of FIG. 1 according to the state of the art in a schematic plan view.
Figure 3:
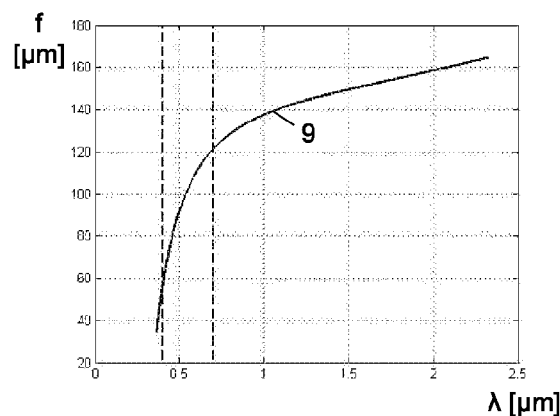
FIG. 3 shows the wavelength dependency of the back focal length of a lens by means of a diagram.

Regarding FIGS. 1 to 3 about the state of the art it is referred to the introduction.

FIG. 4 shows a first embodiment of an inventive device 12, where the same reference numerals denote the same components as in the device 1 of FIGS. 1 and 2. The device 12 can be used as a light source for a pixel of a display or projector or, e.g., for lighting, medical and optical communication applications.

In the embodiment of FIG. 4, the apertures $10_a$, $10_b$, $10_c$ of the light generation units $2_a$, $2_b$, $2_c$ of the device 12 are aligned along an alignment line 13 which in this case also corresponds to an edge 14 of the submount 3. In other embodiments, the alignment line 13 could also be parallel at a distance to the edge 14. The apertures $10_a$, $10_b$, $10_c$ are spaced at equal distances 15, 15' from each other, while the axes $6_a$, $6_b$, $6_c$ of the light beams $5_a$, $5_b$, $5_c$ lie substantially parallel and substantially in a common plane.

The light generation units $2_a$, $2_b$, $2_c$ can be of any kind, e.g., light emitting diodes (LEDs), laser diodes, in particular edge-emitting laser diodes emitting parallel to a p-n transition or vertical-cavity surface-emitting laser diodes (VCSEL diodes) emitting perpendicular to a p-n transition, etc.

To cope with the chromatic aberration, the lens 8, or more specifically its principal plane 16, is substantially mounted at an angle α to the alignment line 13. The principal plane of a rod lens has the property that a ray emerging from a corresponding focal point on one side of the lens seems to bend at the principal plane only (instead of the more complicated optical path within the lens) and then travels perpendicular with respect to the collimation direction (e.g. perpendicular to the direction $d_f$ in case of a FAC lens) after emerging from the principal plane.

In a first embodiment, the lens 8 is a fast axis collimation (FAC) lens, e.g. embodied as a collective rod lens as shown in FIG. 6a, which is used to collimate an incoming beam $5_a$, $5_b$, $5_c$ with respect to the direction $d_f$. The lens 8 has a planar side 17 facing the light generation units $2_a$, $2_b$, $2_c$ and a convex side 18 opposite thereto. To reduce the spherical aberration, the lens 8 is embodied as an acylindrical rod lens having a constant profile (cross-section) along its longitudinal direction 22. The lens 8 could optionally be made out of a material having a graded refraction index (GRIN) in order to assist and/or eliminate the convexity of the side 18.

As the principal plane 16 is aligned at an angle α to the alignment line 13, the three focal points—each one corresponding to the wavelength used—of the lens 8 substantially lie at each one of the apertures $10_a$, $10_b$, $10_c$ of the light generation units $2_a$, $2_b$, $2_c$, i.e. the red focal point substantially lies at the aperture $10_a$ of the light generation unit $2_a$ emitting a red light beam $5_a$ and so forth. As known to the person skilled in the art, the actual "source points" of the light beams $5_a$, $5_b$, $5_c$ can in reality lie a bit further behind the apertures $10_a$, $10_b$, $10_c$ within the light generation units $2_a$, $2_b$, $2_c$.

As was already discussed in the introduction, the chromatic aberration is non-linear. In a further embodiment depicted in FIG. 5, this can be overcome by introducing unequal intervals 15, 15' between the apertures $10_a$, $10_b$, $10_c$. Together with the angle α of the principal plane 16 towards the alignment line 13 and the distance of the lens 8 from the apertures $10_a$, $10_b$, $10_c$, manufacturing tolerances can be divided between these degrees of freedom.

FIG. 6b shows a slow axis collimation (SAC) lens 8, having a planar side 19 and three parallel cylindrical bulges $20_a$, $20_b$, $20_c$ on its opposite side. This lens 8 serves as to collimate the light beams $5_a$, $5_b$, $5_c$ with respect to the direction $d_s$. Since the divergence of the light beams $5_a$, $5_b$, $5_c$ is not as large in this direction $d_s$, there is no need to balance the spherical aberration by forming the bulges acylindrical, however, it could still be done to improve the quality of the optical system. In this embodiment, the lens 8 can thus be seen as a combination of three cylindrical lenses, the focal lengths of which are each wavelength-dependent. The principal planes of the individual bulges coincide spatially for a specific wavelength considered, which is why they are all assigned here to the lens 8 as a (common) principal plane 16.

Again, the principal plane 16, and thereby the lens 8, is aligned at an angle α to the alignment line 13, whereupon a focal point of each bulge $20_a$, $20_b$, $20_c$ coincides with one aperture $10_a$, $10_b$, $10_c$ of the light generation units $2_a$, $2_b$, $2_c$.

FIGS. 7a-10b show further embodiments of combinations of lenses, where a first lens 8—in these cases a FAC lens 8 according to FIG. 6a-is used to collimate the light beams $5_a$, $5_b$, $5_c$ in the first (rapidly diverging) direction $d_f$ and a second lens 21—in the form of a SAC lens 8 as discussed in FIG. 6b—is used to collimate the light beam $5_a$, $5_b$, $5_c$ in the second (slowly diverging) direction $d_s$.

It is understood, however, that the first (front) lens 8 could be a SAC lens as shown in FIG. 6b, collimating the light beam $5_a$, $5_b$, $5_c$ in the direction $d_s$, and that the second lens 21 could be a FAC lens as shown in FIG. 6a to collimate the light beam $5_a$, $5_b$, $5_c$ in the direction $d_f$ (embodiments not shown).

Figure 7A:
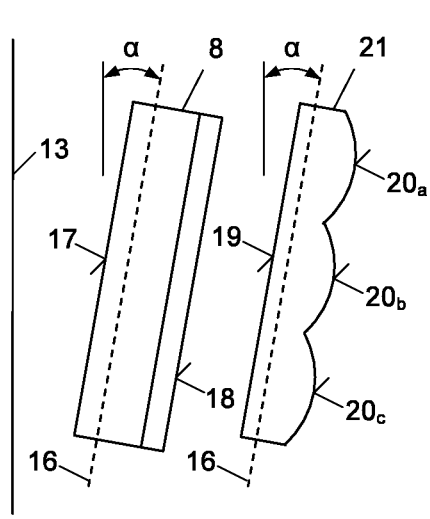
Figure 7B:
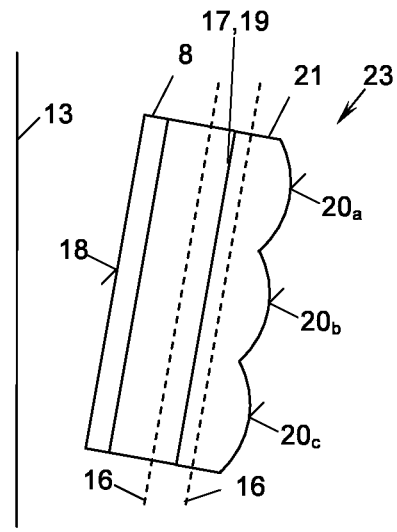

In FIGS. 7a and 7b, the first and second lenses 8, 21 are mounted in succession having their principal planes 16 aligned at the same angle α towards the alignment line 13.

In the embodiment of FIG. 7a, the two lenses 8, 21 are mounted with a spatial displacement so as not to be in contact with each other. Thereby, the lenses 8, 21 can be mounted removably on the carrier 4, making an individual replacement of each one of the lenses 8, 21 possible. The planar sides 17, 19 of the FAC and SAC lenses 8, 21 are facing the light generation units $2_a$, $2_b$, $2_c$.

In the alternative embodiment of FIG. 7b, the two lenses 8, 21 can be combined to a single component 23 by joining, e.g. gluing, their planar sides 17, 19 together, so that the acylindrical side of the FAC lens 8 faces the light generation units $2_a$, $2_b$, $2_c$. Alternatively, the component 23 can be readily formed as a monolithic or one-piece lens, i.e. there is no need for gluing two lenses 8, 21 together.

Figure 8A:
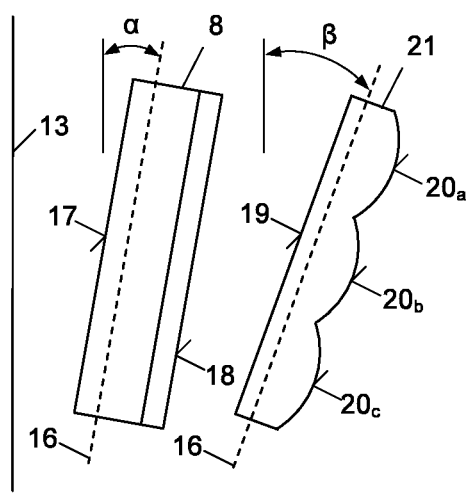
Figure 8B:
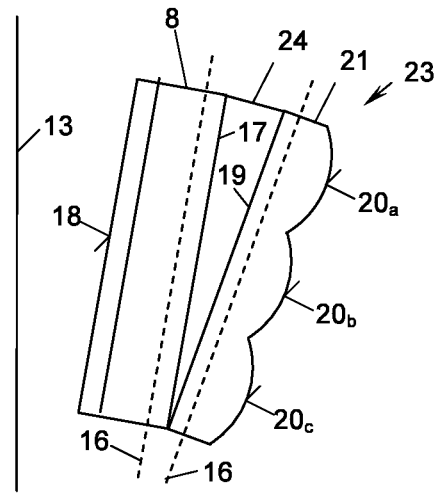

In FIGS. 8a and 8b, the lenses 8, 21 are mounted in succession having their principal planes 16 aligned at different angles α, β towards the alignment line 13. This has a wide series of applications, since the angles α, β are, as known to the person skilled in the art, dependent on several factors, e.g. the choice of material of the lens, the radius of curvature of each segment or bulge, the distance of respective the principal plane from the apertures $10_a$, $10_b$, $10_c$, the respective spacings 15, 15' between the apertures $10_a$, $10_b$, $10_c$, and so forth.

As above, in the embodiment of FIG. 8a, the two lenses 8, 21 are mounted with a spatial displacement to each other so as not to be in contact with each other. Upon joining the lenses 8, 21 together, as shown in FIG. 8b, a transparent wedge 24 is inserted between the lenses, joining the planar side 17 of the first lens 8 to the planar side 19 of the second lens 21, e.g. by gluing the wedge 24 onto the planar sides 14, 18. Thereby it is ensured that the principal planes 16 of the lenses 8, 21 keep different angles α, β with respect to the alignment line 13.

FIGS. 9a and 9b show a combination of a lens 8 tilted at an angle α towards the alignment line 13, after which there is mounted a second lens 21 whose principal plane 16 is parallel to the alignment line 13. To this end, the bulges $20_a$, $20_b$, $20_c$ can optionally be differently shaped, e.g. have different radii of curvature, or can each be made out of different materials to compensate for the chromatic aberration with regard to the lens 21. Again, FIG. 9a shows the lenses 8, 21 having a spatial displacement, while they are joined together (or embodied as a single component) by a wedge 24 in FIG. 9b.

Similarly, FIGS. 10a and 10b show the second SAC lens 21 tilted at an angle α towards the alignment line 13, while the principal plane 16 of the first FAC lens 8 is parallel to the alignment line 13. To compensate for the chromatic aberration with regard to the first lens 8, the first lens 8 can optionally be manufactured in a special way, e.g. with a skewed acylindrical curvature on its side 18. Again, FIG. 10b shows the lenses 8, 21 joined together by wedge 24.

The invention is not restricted to the specific embodiments described in detail herein, but encompasses all variants, combinations and modifications thereof that fall within the framework of the appended claims.

What is claimed is:

1. A device for generating multiple collimated light beams, comprising:
   a carrier;
   at least two light generation units mounted on the carrier, the light generation units being configured to emit, each from an aperture, light beams at respectively different wavelengths and being arranged, with respect to axes of the light beams, substantially parallel and substantially in a common plane; and
   a first lens mounted on the carrier intersectingly to the axes of the light beams and having a principal plane, the first lens being a fast axis collimation lens or a slow axis collimation lens;
   wherein the light generation units have their apertures aligned along an alignment line substantially perpendicular to the axes of the light beams; and
   wherein said principal plane of the first lens is non-perpendicular to the axes of the light beams and is non-parallel to the alignment line.

2. The device according to claim 1, wherein the apertures are spaced at unequal distances from each other along the alignment line.

3. The device according to claim 1, wherein there are three light generation units mounted on the carrier, configured to emit a green, a red and a blue light beam.

4. The device according to claim 1, wherein the light generation units are mounted on the carrier via a submount.

5. The device according to claim 4, wherein the alignment line lies parallel to an edge of the submount.

6. The device according to claim 1, wherein the light generation units each comprise a laser diode.

7. The device according to claim 1, wherein the first lens is made out of a material having a graded refraction index.

8. The device according to claim 1, wherein the first lens is a rod lens having a constant profile along a longitudinal direction of the lens.

9. The device according to claim 1, wherein the first lens has a planar side and at least two parallel cylindrical bulges on an opposite side thereof.

10. The device according to claim 8, wherein a second lens, having a planar side and at least two cylindrical bulges on an opposite side thereof, is mounted before or after the first lens on the carrier when seen in the propagation direction of the light beams.

11. The device according to claim 9, wherein a second lens, being an acylindrical rod lens, is mounted before or after the first lens on the carrier when seen in the propagation direction of the light beams.

12. The device according to claim 10, wherein the second lens has a principal plane which is non-perpendicular to the axes of the light beams and is non-parallel to the alignment line.

13. The device according to claim 12, wherein the principal plane of the first lens lies at a different angle to the alignment line than the principal plane of the second lens.

14. The device according to claim 10, wherein a planar side of the first lens is joined to the planar side of the second lens.

15. The device according to claim 10, wherein there is a transparent wedge joining a planar side of the first lens and the planar side of the second lens.

16. The device according to claim 11, wherein there is a transparent wedge joining a planar side of the first lens and a planar side of the second lens.

17. The device according to claim 5, wherein the alignment line lies on the edge of the submount.

18. The device according to claim 8, wherein the first lens is an acylindrical rod lens.

19. The device according to claim 9, wherein the first lens has three parallel cylindrical bulges.

20. The device according to claim 10, wherein the second lens has three cylindrical bulges.

21. The device according to claim 14, wherein the planar side of the first lens is monolithically joined to the planar side of the second lens.

22. The device according to claim 15, wherein the transparent wedge monolithically joins the planar side of the first lens and the planar side of the second lens.

23. The device according to claim 16, wherein the transparent wedge monolithically joins the planar side of the first lens and the planar side of the second lens.

* * * * *